United States Patent
Hnilo et al.

(10) Patent No.: US 6,465,898 B1
(45) Date of Patent: Oct. 15, 2002

(54) BONDING ALIGNMENT MARK FOR BONDS OVER ACTIVE CIRCUITS

(75) Inventors: Laura A. Hnilo, McKinney; Mike P. Pierce, Plano; Roy A. Hastings, Allen; David Grant, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/911,557

(22) Filed: Jul. 23, 2001

(51) Int. Cl.[7] ............... H01L 23/544; H01L 23/48; H01L 23/52; H01L 29/40
(52) U.S. Cl. .............. 257/797; 257/734; 257/798
(58) Field of Search .................. 257/784, 797, 257/734, 798

(56) References Cited

U.S. PATENT DOCUMENTS 5,936,311 A * 8/1999 Watrobski et al. ............ 257/48
6,077,756 A * 6/2000 Lin et al. .................. 257/797

* cited by examiner

*Primary Examiner*—Carl Whitehead, Jr.
*Assistant Examiner*—Kiesha Rose
(74) *Attorney, Agent, or Firm*—W. James Brady, III; Frederick J. Telecky, Jr.

(57) ABSTRACT

A semiconductor chip bearing an alignment mark, particularly useful for wire bonder alignment on chips having bonding surfaces over the active circuits. The marks are fabricated on diagonal corners of the chip, and each mark consists of a pair of touching squares which are rotated about 90 degrees from each other in the opposite chip corners. The unique positioning of the marks, as well as the rotation provides both gross chip position features useful in mounting the chip on a lead frame, as well as fine alignment set-up or teaching aids for wire bonding. The small, high visual contrast features of the alignment mark are fabricated simultaneously with the top active metallization of the IC chip, and are not covered by passivation coating or additional metal layers.

11 Claims, 2 Drawing Sheets

BONDING ALIGNMENT MARK FOR BONDS OVER ACTIVE CIRCUITS

FIELD OF THE INVENTION

The present invention relates generally to integrated circuits, more particularly to alignment features which facilitate wire bonding to integrated circuits, and even more particularly to circuits having the bonding surface positioned atop active circuitry.

BACKGROUND OF THE INVENTION

Integrated circuit (IC) devices include a plurality of metallized bond pads where electrical connections to the device are made, either by wire bonds, flip chip bump connections, or flexible contacts to metal bumps, such as TAB (Tape Automated Bonding). Typically, the bond pads as well as their buses are placed in the periphery of the integrated circuit, outside the area containing active components. This conventional structure for the bond pads adds to the required area of the IC, which in turn reduces production efficiency, increases the size of each IC, and adds to the resistance current path.

Recently integrated circuits having wire bonding surfaces or pads positioned directly over active circuitry have been disclosed in U.S. Pat. No. 6,144,100 granted Nov. 7, 2000, U.S. patent application No. 60/221,051 filed on Jul. 27, 2000, and U.S. patent application Ser. No. 09/611,623 filed on Jul. 7, 2000. The structure of these devices assumes at least one metallization layer for active circuitry covered by an insulating, protective coating through which vias are formed to provide a means for interconnection between the active metallization layer on the IC, and a thicker, multilayer of metals which form a bonding surface. The multilayer of metals includes a seed metal layer, such as titanium, a plated support layer, such as copper, and a bonding layer, such as gold or palladium. The support layer is a relatively thick layer, in the range of 10–30 microns which serves to absorb stresses of the wire bonding process, and to protect the underlying active circuitry. The multilayer of metals provides advantages to the device in thermal enhancement, in minimizing the number of external output contacts by providing common power or ground connections, and in minimizing chip size by eliminating some or all of the perimeter bond pads. Alternately, bonding over active circuits has been reported wherein a dielectric material provides the support layer to minimize stresses, and one or more layers of metal provide the bonding surface. (Heinen, G., Stierman, R. J., Edwards, D. and Nye, L. *IEEE Proc. of 44th ECTC,* 1994). Flip chip devices are frequently designed with solder bump contacts positioned directly over active circuits. In each of these device types, the ability to visually detect reference or alignment marks on the active surface of the chip may be obscured by thick passivation, and metallization.

In the process of wire bonding a semiconductor device having either conventional bond pads on the perimeter of the chip, or on a bonding surface over the active circuitry, it is necessary to input precise bonding coordinates to a pattern recognition system of an automated wire bonding equipment. The most usual method of inputting these coordinates is to perform a teaching operation in which the first object to be bonded is magnified by a camera, and displayed on a monitor. An operator carries out an operation by specifying the coordinates to be bonded while viewing the image on the monitor. The X-Y stage of the bonder is adjusted so that the starting point of the first wire is displayed on the monitor, and the coordinates stored. Next the same teaching operation is carried out for the coordinates of the end point of the wire. Typically, the start point is the bonding pad on the chip, and the end point is a lead finger on a lead frame. The procedure is carried out sequentially for all the wires to be bonded. Reference or alignment marks are used as an aid or guide for carrying out the alignment. Typically the reference marks on the IC are a cross, a rectangle, or the bond pads themselves patterned in the active metal layer, but such marks are not standardized throughout the industry.

Accuracy of the bond wire position is related to the ability of the operator to view the alignment marks, and make accurate input to the pattern recognition system. Lighter colored patterns, or reflective features generally provide better alignment marks owing to the higher level of contrast with a darker non-bonding surfaces, particularly as viewed by vertical lighting which is commonly used with wire bond equipment. Bonding surfaces positioned over active circuits diffuse visibility to underlying bond reference marks on the active area, and exhibit very little contrast across the device surface, thereby causing accurate bonding alignment to be significant problem. The bond wires must be positioned in precise locations, according to the device design, and must avoid the vias connecting the bonding surface to the active circuit.

Flip chip bonding of solder bumps to receiving pads on a substrate requires only a single bond process for all input/output (I/O) contacts, but alignment does suffer from issues of depth of focus because of the raised bumps, and inability to clearly recognize specific corner locations, particularly on those devices having symmetrical contacts because of thick passivation and metallization on the chip surface. Similar issues are found for other bumped devices, such as TAB bonded circuits.

Lack of ability to readily recognize the reference or alignment marks slows the bonder teaching process, as well as results in bonding failures at a very costly point in the fabrication of an IC device. Further, as use of subcontract IC package manufacturing for many different IC fabricators has become more prevalent, standardization of the alignment targets is a more important concern for yield, throughput, and overall assembly cost.

Because of the aforementioned issues, and the anticipation of an increase in the number of integrated circuit chips with bonding surfaces covering the active circuit, an alignment or reference mark on the surface of integrated circuits which is readily visible using vertical lighting of an automated bonding equipment would be advantageous to the industry, and in particular for those circuits having a metallized bonding surface atop the active circuitry.

SUMMARY OF THE INVENTION

It is an object of the invention to provide alignment marks on the surface of an integrated circuit which are readily visible by wire bonding equipment.

It is an object of the invention to provide alignment marks for bonding to ICs having a metallized bonding surface atop active circuitry.

It is an objective of the invention to provide exposed alignment marks having good contrast from that of the major surface of the chip.

It is an object of the invention that the alignment marks are small, and require the minimum amount of chip area.

It is further an objective of the invention to provide a pair of unique reference marks in opposite corners of the chip.

It is further an objective of the invention to provide standardized reference marks which are unique as bonding alignment features, and are the same across a spectrum of circuit types, and bonding surfaces.

It is further an objective of the invention to provide standardized bond reference marks which are applicable to flip chip, other bumped chips, or chips having conventional wire bond pads.

These objectives will be met by fabricating alignment marks positioned on diagonal corners of the chip, each mark consisting of a touching dual square patterns which are rotated about 90 degrees from each other in the opposite chip corners. The unique positioning of the marks, as well as the rotation provides both gross chip position features useful in mounting the chip on a lead frame, as well as fine alignment set-up or teaching aids for wire bonding.

The features of the alignment mark are fabricated in the top active metallization of the IC chip, and are not covered by passivation coating or additional metal layers, such as those metal layers used for bonding over active circuits. The exposed alignment marks provide high contrast to either the active metallization layer which is covered by passivation, or the bonding surface metallization of alternate materials. The lack of passivation atop the photopatterned alignment marks allows sharp definition of the exposed marks, which in turn allows the marks themselves to be smaller than those typically recommended in the industry. Further, the unique alignment and positioning marks are readily standardized for all types of integrated circuits, and thus a significant asset to assembly sites.

The features and advantages of the invention will become more apparent from the detailed description which proceeds with reference to the accompanying drawings.

DETAILED DESCRIPTION OF THE DRAWINGS

In order to better explain the present invention, it is necessary to illustrate the problem associated with providing bonding coordinates to an automated wire bonder, and in particular on those integrated circuit chips having metallic bonding surfaces positioned directly atop active circuitry (BOAC). The term active circuitry is assumed to include one or more layers of metal interconnections and buses of an integrated circuit. In addition, the circuitry most often will include multiple patterned layers of dielectric materials and polysilicon which contribute to variations in reflectivity and uneven topography. Conductive vias connect metallization of the active circuits to a relatively thick metal bonding surface covering a portion of the active circuitry.

Figure 1A:
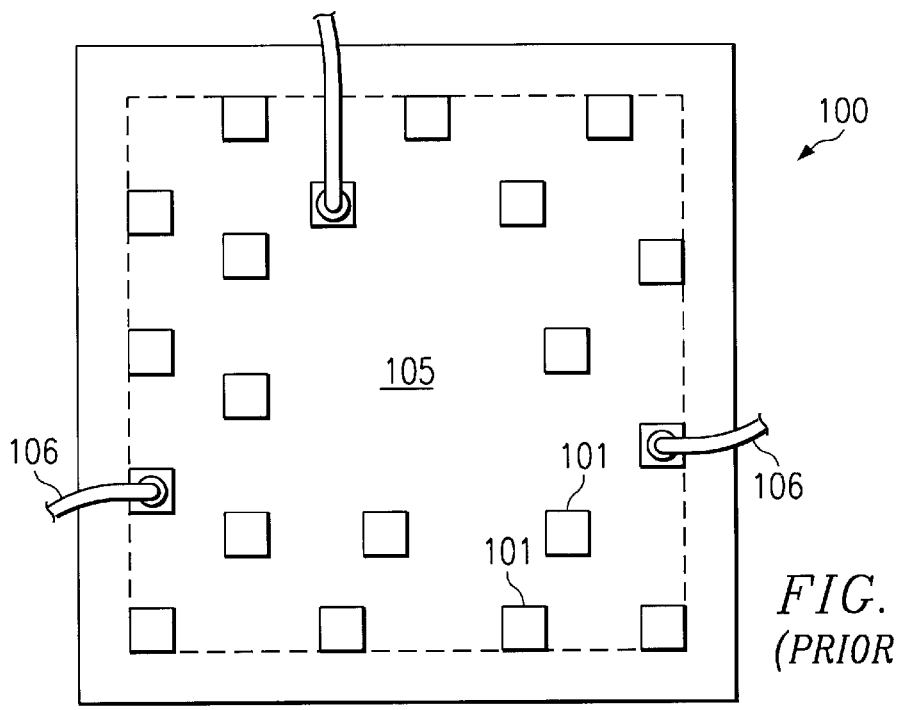
FIGS. 1a and 1b illustrate bonding surfaces of two integrated circuit devices having the bonding surface positioned over active circuitry. (Prior art)
Figure 1B:
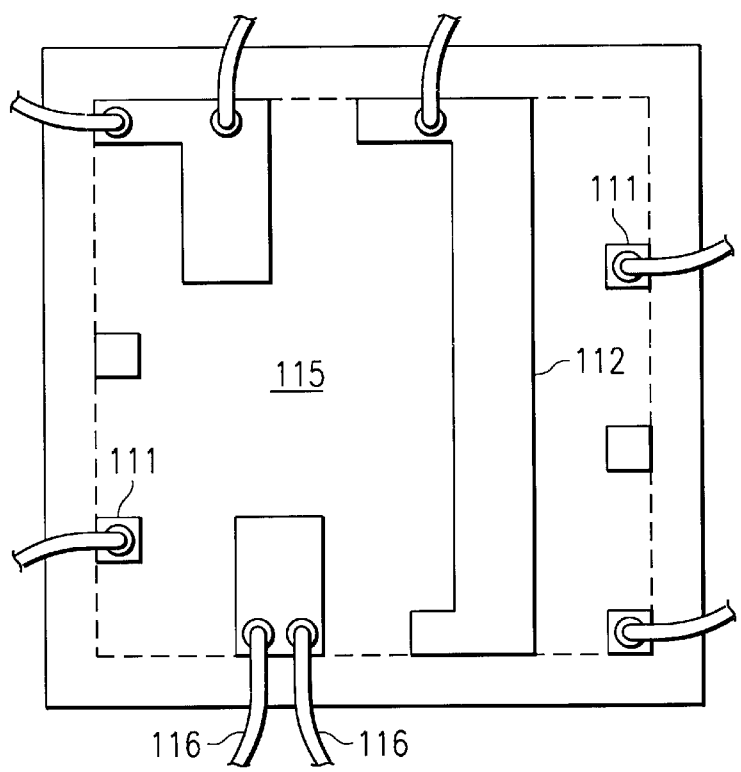

FIGS. 1a and 1b are examples of devices having bonding surfaces atop active circuits, and having significantly different bonding locations and appearances. In FIG. 1a, the bond sites 101 are arrayed in a near symmetrical pattern over the active area 105 of the semiconductor chip 100. An array of this general configuration is not unusual for devices to be wire bonded over active circuits (BOAC) to provide wire connections (106), or for devices having flip chip contacts.

FIG. 1b not only shows individual bonding sites 111 near the chip perimeter, but also includes larger areas of metallization 112 which serve as bonding sites, as well as bus structures for multiple contacts to the active circuit, and which further allow multiple bond wires 116 to be attached for high current connections.

In the preferred embodiment, a pair of bonding alignment marks are incorporated on a semiconductor chip having the bond surface over active circuits. Integrated circuit chips having the bonding surface over active circuits have been described in U.S. Pat. No. 6,144,100 granted Nov. 7, 2000, in U.S. patent application Ser. No. 09/611,623 filed on Jul. 7, 2000, and in U.S. patent application No. 60/221,051 filed on Jul. 27, 2000 which are included herein by reference. The metallization layers of the bonding surface include a very thin seed layer of titanium, chromium, or alloys of the such materials, and a much thicker plated layer of copper. Atop the plated copper, and forming the bonding surface is a layer of nickel covered by the final bonding layer of palladium. Both nickel and palladium are somewhat dull, grayish colored metals. Alternate metal systems for bonds over active circuits have been described in the referenced patents and applications.

It can be seen that the metallized bonding surfaces 101 in FIG. 1a, and 111 and 112 in FIG. 1b are positioned directly over active circuitry 105 and 115 respectively, and that it would be difficult to discern specific features on the chip which are used to provide coordinates to a pattern recognition system of a wire bonder when viewed with vertical lighting. Precise locations on the active surface are obscured both as a function of the topography causing inability to focus clearly, and by interference from various reflective surfaces of the active and bonding layers.

Figure 2:
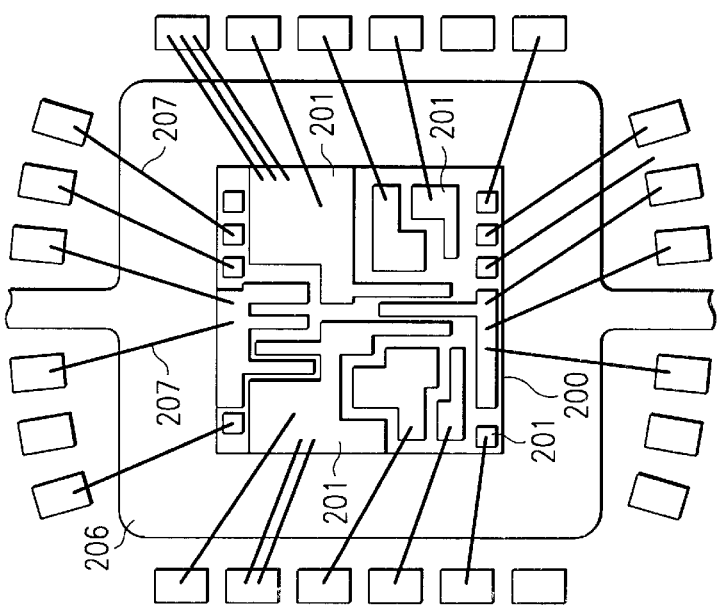
FIG. 2 is an illustration of a large area of metal surface on a device having bonds over active circuits (BOAC). (Prior art)

FIG. 2 is yet another example of an integrated circuit chip 100 having bonding surfaces 201 over active circuits mounted on a lead frame pad 206 with bond wires 207 attached. In this example large areas of a relatively thick multi-layer of metal serve to dissipate heat, and have multiple vias contacting power and ground circuits on the chip. Because much of the surface area is covered with a somewhat opaque metal, it is difficult to visualize precise locations for the bond wires 207, and to establish coordinates for the vision system of a wire bonder. Precise positioned of the wires is necessary to avoid overlying vias which could in turn lead to unreliable contacts.

Figure 3:
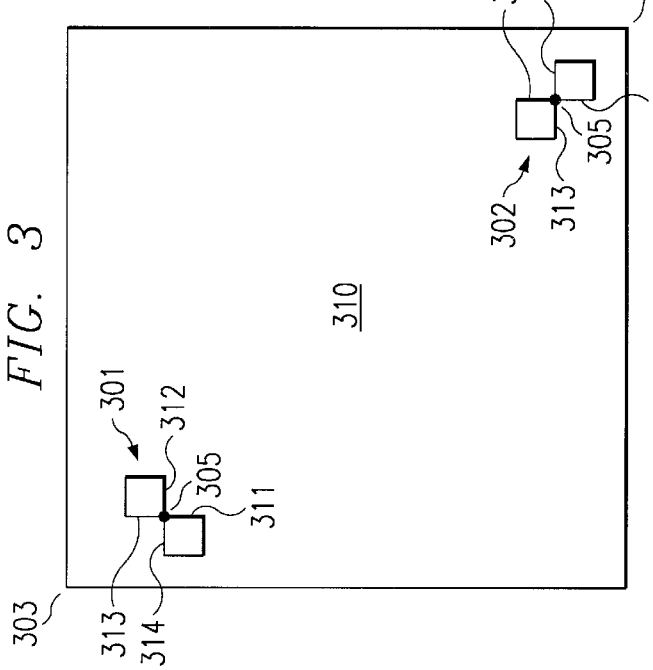
FIG. 3 illustrates the position and location of bond alignment marks of the preferred embodiment.

The bonder alignment marks of the preferred embodiment illustrated in FIG. 3 provide clearly visible bond alignment features which allow a vision system to recognize specific locations on an integrated circuit chip, and be able to precisely define coordinates for a wire bonder. In order to provide highly visible reference marks on an integrated circuit chip having the bonding surface atop the active circuits, it is necessary to select both a structure, and a location which can be applied to a number of integrated circuits chips having a variety of different surface metallization patterns. The clearly visible alignment marks 301 and 302 provides features which have a bright appearance, and are sharply defined.

FIG. 3 illustrates the preferred approximate locations on a chip, and the shape of the bonding alignment mark. The preferred shape of the marks are dual touching squares 301 and 302 having one small square positioned diagonally across from a second square, and touching at a central corner 305 location. The first mark 301 is positioned near the first corner 303 of the IC chip 310, and a second mark 302 is positioned in the opposite corner 304 of the chip, diagonally across from the first mark. The pair of marks 301, 302 in the chip corners 303 and 304 provide orientation and gross positioning of the chip. Defining chip orientation is significant both in the pick and place, and the bonding operation, particularly for devices having symmetrical surface features, and those having obscured active circuit features.

The squares of the second mark 302 are rotated 90 degrees from those of the first mark 301, thereby allowing the chip corner position 303 to be readily distinguished from corner position 304.

Fine alignment features in each chip corner are readily recognized as a cross formed by the inner segments 311, 312, 313, and 314 of each square.

Figure 4:
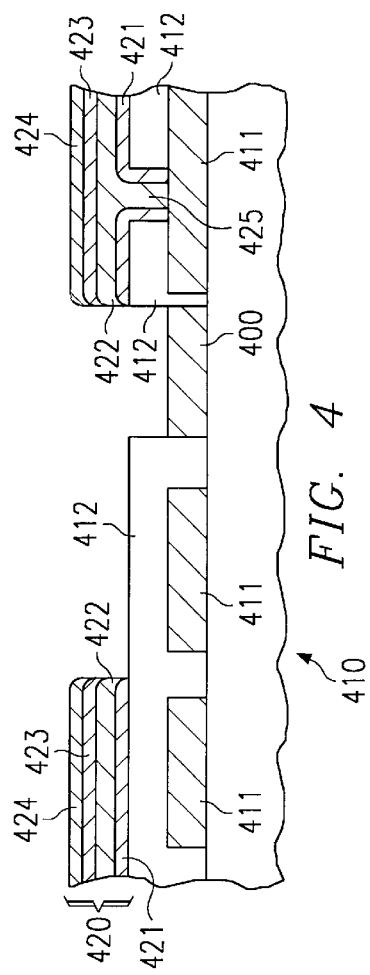
FIG. 4 is a cross sectional view of a BOAC chip through the bond alignment mark and chip surface.

FIG. 4 is a cross section of a portion of the alignment mark 400 and multiple material layers of the chip surface 410, excluding the active circuitry except the top level metal 411. In the preferred embodiment, the alignment mark is formed simultaneously with the active metal pattern 411 of an integrated circuit having a bonding surface over active circuitry (BOAC) 420. The alignment mark 400 is comprised of, and is patterned with the top level active metallization 411 of the integrated circuit, typically a thin film of aluminum or an aluminum alloy having a light color and somewhat reflective surface. A dielectric or passivating layer 412 covers the active metallization, except the alignment mark 400.

In the preferred embodiment of an integrated circuit with a bonding surface 420 over the active circuit, the bonding layer comprises a seed metal 421 which was used as a plating electrode, a thick plated support layer 422, a thin layer of nickel 423 which acts as a diffusion barrier, and a top layer 424 of a noble metal onto which a bond wire will be placed. Metallized vias 425 provide a means for electrical contact between the active metal traces 411 and the bonding surface metallization 420.

The exposed alignment mark 400 having a bright metal surface provides good contrast to the uppermost chip surface, including a combination of chip passivation 411 and bonding surface metals 420, and is readily detected by a camera and video system on a wire bond equipment.

Visual contrast coupled with the sharply defined features formed by photo-defining the alignment feature, and removing the protective overcoat allow the alignment mark itself to be made smaller than bond alignment marks previously included on conventional chips, or those recommended by bond equipment suppliers. The alignment mark of the preferred embodiment is in the range of 50 to 75 microns on a side, or 25 to 35 microns per segment of the small squares. Experimental evidence has supported that the smaller mark provides equal bond accuracy to those of 100 microns or greater on a side.

The dual touching squares alignment mark has been discussed with preference to integrated circuit chips having a wire bonding surface over active circuitry, however, the mark is applicable to flip chip integrated circuit chips. In flip chip technology, an alignment mark is useful to orient the chip to the substrate, and to precisely align the bumps to a substrate.

Further, the bond alignment marks are applicable to integrated circuits having conventional bonding surfaces. As a result of topography, reflection,-lack of contrast, or a combination of these features, it is difficult for the vision system of wire bonder equipment to distinguish the alignment coordinates accurately, therefore, the exposed touching squares alignment marker provides a useful mechanism for precision alignment of these devices.

While the invention has been described with reference to specific embodiments, and to a specific feature shape, it is not intended to limit the scope to a particular form set forth. The preferred shape of the bond alignment mark is a pair of touching diagonal squares, however, any number of alternate shapes, which can be rotated to allow differentiation between the chip corners are applicable. The invention is intended to cover alternatives, modifications, and equivalents as may be included within the spirit of the invention as described by the appended claims.

What is claimed is:

1. A semiconductor chip bearing an alignment mark having highly visual contrast to the uppermost surface of said chip, said mark including:
    a) a patterned feature comprised of the metal of the active circuit metal layer, exposed with no other material covering said feature,
    b) said feature consisting of dual touching squares positioned diagonally from each other,
    c) one of said marks located near the first corner of said chip,
    d) a second mark located near the third corner, or the diagonally opposite corner of said chip,
    e) said dual squares in third corner are rotated 90 degrees from the squares in the first corner.

2. A semiconductor chip as in claim 1 wherein the composition of said alignment mark is different from the composition of said uppermost surface of the semiconductor chip.

3. A chip as in claim 1 wherein said alignment mark comprises aluminum.

4. A chip as in claim 1 having at least a portion of the uppermost surface comprised of multiple layers of metal atop the active circuits.

5. A chip as in claim 1 wherein patterned features of said alignment mark are equal to or less than 75 microns.

6. A chip as in claim 1 wherein the inner segments of the dual touching squares of said alignment mark form a cross.

7. A chip as in claim 1 wherein said alignment marks are wire bonder alignment targets.

8. A chip as in claim 1 wherein said alignment marks are readily detectable by the vision system of a wire bond equipment using top light illumination.

9. A chip as in claim 1 having features of said alignment mark defined and exposed by photopatterning and etching.

10. A chip as in claim 4 wherein said surface metallization comprises a seed metal, a support layer, and a bondable noble metal layer.

11. A chip as in claim 1 having flip chip contacts.

* * * * *